United States Patent
Choi et al.

(10) Patent No.: US 10,615,222 B2
(45) Date of Patent: Apr. 7, 2020

(54) FLEXIBLE GAN LIGHT-EMITTING DIODES

(71) Applicant: THE UNIVERSITY OF HONG KONG, Hong Kong (CN)

(72) Inventors: Hoi Wai Choi, Hong Kong (CN); Kwai Hei Li, Hong Kong (CN); Yuk Fai Cheung, Hong Kong (CN)

(73) Assignee: The University of Hong Kong, Hong Kong (CN)

( * ) Notice: Subject to any disclaimer, the term of this patent is extended or adjusted under 35 U.S.C. 154(b) by 0 days.

(21) Appl. No.: 14/831,300

(22) Filed: Aug. 20, 2015

(65) Prior Publication Data

US 2016/0233269 A1    Aug. 11, 2016

Related U.S. Application Data

(63) Continuation of application No. 62/040,253, filed on Aug. 21, 2014.

(51) Int. Cl.
*H01L 27/15*    (2006.01)
*H01L 33/00*    (2010.01)
*H01L 25/075*    (2006.01)

(52) U.S. Cl.
CPC .......... *H01L 27/156* (2013.01); *H01L 33/007* (2013.01); *H01L 33/0075* (2013.01);
(Continued)

(58) Field of Classification Search
CPC ............... H01L 27/156; H01L 33/0075; H01L 33/0095; H01L 33/007; H01L 33/0079; H01L 25/0753
See application file for complete search history.

(56) References Cited

U.S. PATENT DOCUMENTS 6,177,352 B1 *   1/2001   Schonfeld .........  H01L 21/30621
                                                  257/E21.222
7,210,818 B2 *   5/2007   Luk ..........................  F21S 4/26
                                                  361/749
(Continued)

FOREIGN PATENT DOCUMENTS

CN        1801459 A       7/2006
CN       101120433 A       2/2008
(Continued)

OTHER PUBLICATIONS

Chun, J., et al., Transfer of GaN LEDs from Sapphire to Flexible Substrates by Laser Lift-Off and Contact Printing, IEEE Photonics Technology Letters, Dec. 1, 2012, 24(23):2115-2118, 2012 IEEE.
(Continued)

*Primary Examiner* — Dale E Page
*Assistant Examiner* — Quovaunda Jefferson
(74) *Attorney, Agent, or Firm* — Saliwanchik, Lloyd & Eisenschenk (57) ABSTRACT

Methods of fabricating flexible, free-standing LED structures are provided. An LED structure can be formed on a sapphire substrate, and the surface of the LED structure can then be coated with epoxy and attached to a rigid supporting substrate. A laser lift-off process can be performed using an ultraviolet beam from a high-power pulsed-mode laser and a shadow mask, causing at least a portion of the LED structure to separate from the sapphire substrate. The structure can then be immersed in an acetone bath to dissolve the epoxy and separate the structure from the supporting substrate.

29 Claims, 8 Drawing Sheets

(52) U.S. Cl.
CPC ...... *H01L 33/0079* (2013.01); *H01L 33/0095* (2013.01); *H01L 25/0753* (2013.01); *H01L 2924/0002* (2013.01)

(56) References Cited

U.S. PATENT DOCUMENTS

| | | | |
|---|---|---|---|
| 2003/0178937 A1* | 9/2003 | Mishima | H01L 51/52 313/511 |
| 2004/0245543 A1* | 12/2004 | Yoo | H01L 33/0079 257/103 |
| 2005/0042845 A1* | 2/2005 | Urbanek | C30B 25/02 438/483 |
| 2005/0142379 A1* | 6/2005 | Juni | G02B 5/0242 428/690 |
| 2005/0242365 A1* | 11/2005 | Yoo | B82Y 20/00 257/103 |
| 2006/0189020 A1 | 8/2006 | Kim | |
| 2007/0075320 A1* | 4/2007 | Hata | B82Y 20/00 257/79 |
| 2007/0152577 A1* | 7/2007 | Cho | B32B 27/08 313/511 |
| 2010/0060553 A1* | 3/2010 | Zimmerman | H01L 25/0753 345/60 |
| 2010/0317132 A1* | 12/2010 | Rogers | H01L 25/0753 438/27 |
| 2014/0340609 A1* | 11/2014 | Taylor | G02F 1/133308 349/58 |

FOREIGN PATENT DOCUMENTS

| | | |
|---|---|---|
| CN | 101304063 A | 11/2008 |
| CN | 101764185 A | 6/2010 |
| JP | 2006-332681 A1 | 12/2006 |

OTHER PUBLICATIONS

Lee, S.Y. et al., Water-resistant flexible GaN LED on a liquid crystal polymer substrate for implantable biomedical applications, Nano Energy, 2012, 1:145-151, 2011 Elsevier Ltd.

International Search Report dated Nov. 27, 2015 in International Application No. PCT/CN2015/087778.

Office Action dated Sep. 10, 2018 in Chinese Application No. 201580044661.7.

* cited by examiner

FLEXIBLE GAN LIGHT-EMITTING DIODES

CROSS-REFERENCE RELATED APPLICATIONS

This application claims the benefit of U.S. Provisional Application Ser. No. 62/040,253, filed on Aug. 21, 2014, which is hereby incorporated by reference in its entirety, including any figures, tables, or drawings.

FIELD OF THE INVENTION

The subject matter disclosed herein relates to flexible light-emitting diode (LED) devices.

BACKGROUND

Organic LEDs (OLEDs) have long been touted as the exclusive materials for flexible optoelectronic/electronic devices. Some familiar examples of daily use of flexible OLED display products include smart phones and flat screen LED televisions. However, OLEDs have drawbacks, such as a short lifetime (~10,000 hrs), low efficiency, and low stability in high humidity conditions compared to inorganic LEDs. That is, inorganic emitters are superior to OLEDs in many aspects, including stability, output power, efficiency, and lifetime. Also, inorganic LEDs have a wide spectral range, from near-ultraviolet to infrared, and the emission wavelength can be tailored and designed based on the amount of indium in the composition and/or the thickness of the quantum wells in the active region of the inorganic LED.

Typically, inorganic LEDs are grown on thick, hard, stiff substrates, including but not limited to sapphire, silicon, silicon carbide or gallium nitride, using the growth techniques of metal oxide chemical vapor deposition (MOCVD) or molecular beam epitaxy (MBE). As such, these devices are not able to be deformed or bent without damage to the mechanical structure.

However, recent research efforts have brought Group III-nitride light-emitting diodes (LEDs) on a flexible platform closer to reality. The Group III-nitride inorganic devices, in particular gallium nitride (GaN) devices, have been used commercially in green, blue, and white LEDs, and have proven long lifetimes with high brightness and efficiencies. Existing demonstrations of flexible inorganic LEDs rely on the transfer of micro-patterned LED arrays from sapphire or Si substrates onto a plastic/polymer foreign substrate, so that the emitters appear to adopt the curvilinear profile of the flexible substrate. However, the LEDs themselves are not flexible; the flexibility is still limited to the extrinsic substrate.

Chun et al. ("Transfer of GaN LEDs from Sapphire to Flexible Substrates by Laser Lift-Off and Contact Printing," *IEEE Photon. Technol. Lett.* 24, 2115, 2012) disclose fabrication of flexible GaN-based LED systems by laser lift-off (LLO) and transfer printing methods. LLO enables transferring a whole GaN LED layer from sapphire onto a silicon handling wafer to provide a stable platform for any shape of LED. Polymer pedestal structures underneath the LEDs support efficient transfer printing of the patterned LED array from the silicon handling wafer to a flexible substrate.

However, there are significant drawbacks associated with the method of placing inorganic LEDs on silicon wafers, including non-uniformities between individual emitters, complex assembly processes, high manufacturing cost, and poor reliability. More importantly, the LEDs themselves are not flexible; the flexibility is still limited to the extrinsic substrates.

BRIEF SUMMARY

Embodiments of the subject invention include truly continuous-film, flexible, free-standing LED structures and methods of fabricating the same. Advantageously, the flexible LEDs of the subject invention are themselves freestanding and flexible, and do not need to rely on the flexibility of a destination substrate. Such LEDs can theoretically be attached to any material.

According to an exemplary embodiment, a GaN light-emitting diode (LED) (e.g., grown on a sapphire base) can be fabricated using standard micro-fabrication procedures. This structure can be temporarily mounted on a rigid supporting layer (e.g., glass), and this can be done, for example, with an epoxy. A laser lift-off (LLO) process can be performed to separate the LED structure or strip from the base (e.g., sapphire base). The LLO process can use a collimated high-energy UV laser beam (e.g., 266 nm). The LED structure or strip can then be immersed in a bath (e.g., an acetone bath) so that the LED structure or strip is at least partially separated from its base.

By removing the sapphire base from the LED strip and using epoxy and a rigid supporting substrate as an intermediate buffer layer, flexible GaN LED strips can be obtained. The free-standing GaN LED stack or strip alone is flexible. The LED strip becomes suspended to form a free-standing structure that can bend upwards due to the built-in strain in the semiconductor film. The degree of curve effect is governed by the thickness, length, and strain of the film.

The exposure of the entire GaN structure to the laser beam during the LLO process allows the flexible GaN structure to be completely detached from the base and then to be attached to foreign substrates, including but not limited to metals and polymers.

In addition to using a straightforward approach to form the flexible and bendable strip, bowl-shaped LEDs can also be achieved by selectively lifting off polygonal or circular shaped mesas. Such shapes provide a compact and elegant way to alter emission divergence of the LED.

In one embodiment, prior to the attaching and selective lift-off processes, a GaN-based emissive micro-pixel array can be formed on one end of an LED strip by a standard fabrication process. With proper design of the metal contact layer, the individual pixels can be operated independently on the flexible end to form a micro-display panel.

In another embodiment, the continuous semiconductor film can be coated with thick, soft, metal layers that function as a flexible support, as well as an electrically-conductive layer and bonding pads. After complete detachment of the base substrate via the LLO process, a continuous-film flexible LED can be formed without attachment to a substrate, and the entire LED can be bent on its own.

BRIEF DESCRIPTION OF THE DRAWINGS

The foregoing and other objects and advantages of the present invention will become more apparent when considered in connection with the following detailed description and appended drawings in which like designations denote like elements in the various views.

FIGS. 1(a) to 1(d) show cross-sectional views of a method of fabricating a flexible GaN LED according to an embodiment of the subject invention.

DETAILED DESCRIPTION

Embodiments of the subject invention include truly continuous-film, flexible, free-standing LED structures and method of fabricating the same. Advantageously, the flexible LEDs of the subject invention are themselves freestanding and flexible, and do not need to rely on the flexibility of a destination substrate. Such LEDs can theoretically be attached to any material.

Figures 1A, 1D:
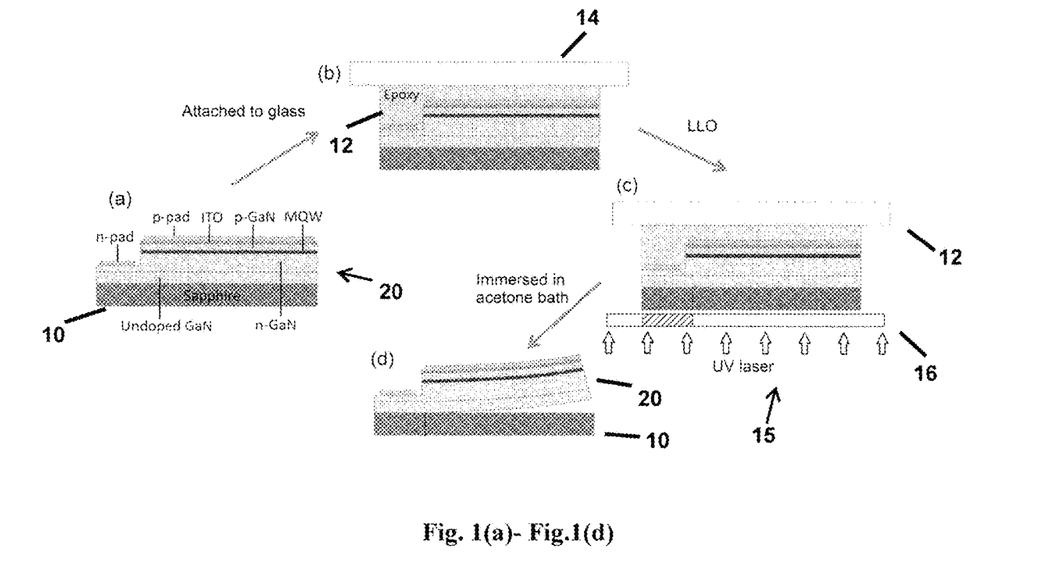

Methods of the subject invention include fabricating a truly flexible, free-standing light-emitting diode (LED) structure (e.g., a GaN LED structure), without requiring substrate transfer. FIGS. 1(a) to 1(d) show cross-sectional views of a method of fabricating a flexible GaN LED according to an embodiment of the subject invention. FIG. 1(a) shows a light-emitting device 20 being fabricated using standard micro-fabrication procedures, including photolithography, etching, and metal deposition. In particular, GaN-based LED wafers can be grown by metal organic chemical vapor deposition (MOCVD) on a substrate 10 (e.g., a sapphire substrate). The LED structures with defined mesa areas can be diced by pulsed-mode ultraviolet (UV) laser micromachining. The resulting GaN light-emitting diode structure can include an n-type GaN layer, an active layer of multiple quantum wells, and p-type GaN layer sequentially formed on the substrate 10. Also, the optically semi-transparent current spreading layer, typically using Ni/Au or indium-tin-oxide (ITO), can be deposited on a top surface of the p-type GaN layer. Such layers can be deposited using, for example, thermal evaporation, sputtering, or electron beam evaporation.

In forming the device of FIG. 1(a), a layer of photoresist can be spin-coated onto the current spreading layer and selectively exposed to UV light through a photo mask with a pre-defined pattern, corresponding to the mesa of the LED. The exposed sample can be developed in a bath of photoresist developer. After development, the photoresist pattern can be hard baked (e.g., at 120° C. for 5 minutes). The uncoated regions of GaN can be etched away until the underlying n-type layer is exposed. The etching can be achieved in many ways, including but not limited to plasma etching, ion etching, and laser etching. The photoresist pattern is defined to expose areas of p-type and n-type contact pads using another photolithography process. A bi-layer of Ti/Au can be deposited by electron beam evaporation and lifted off in a bath (e.g., an acetone bath). Contacts can be subjected to rapid thermal annealing (RTA), for example at 550° C. for 5 minutes in nitrogen ambient. The bottom surface of the substrate (e.g., sapphire) can be mechanically lapped or polished to reach optical smoothness, and the individual LEDs can be diced in many ways, such as by laser machining and/or a diamond dicing saw.

In an embodiment, because the removal of the substrate 10 can cause relaxation of build-in strain on the device, the top face of the device (the p-GaN layer with a coating of current conductive layer) can be temporarily attached to a rigid supporting substrate 14 via an adhesive layer 12, as shown in FIG. 1(b). Such a supporting substrate should have a smooth surface and be rigid and inflexible; suitable materials include but are not limited to silicon, sapphire, and quartz glass. The LED device can be mounted onto the substrate using a die bonding machine. A certain amount of adhesive 12 (e.g., epoxy), depending on the size of device, can be used to cover the entire chip surface using an adhesive dispenser. Preferably, the adhesive layer can be made of organic epoxy resins that can be dissolved in an organic solvent in a later process. The bonded sample can be loaded into a vacuum de-gassing chamber to remove the air bubbles trapped within the adhesive layer and to ensure that the device surface is completely in contact with the adhesive. The initial flowable adhesive (e.g., epoxy) may have to be heat-cured so as to undergo a transition from liquid to solid state. Elevated temperatures, achieved with for example the use of a hot plate or oven, can accelerate the curing process to attain solid state. Complete solidification of the adhesive (e.g., epoxy) is important to enable the device to withstand the pressure induced by the formation of gas bubbles during detachment of the (sapphire) substrate. In one embodiment, an epoxy adhesive can be allowed to solidify for about 12 hours in order to completely cure the epoxy to a solid state.

Because of the intrinsic properties of a sapphire substrate (i.e., hard and inflexible), it should be removed so as to expose the flexible continuous semiconductor crystalline film. This can be achieved via one of several methods, including but not limited to mechanical polishing, chemical etching, and/or a laser lift-off (LLO) process.

In one embodiment, mechanical grinding is employed to remove a major portion of the sapphire substrate; however, such a method may introduce scratches on the sapphire surface. Additional chemical/mechanical polishing may be required to remove the scratches and to recover the surface to its original smoothness In another embodiment, the sapphire can be removed or lifted-off by irradiating a uniform high-intensity laser beam 15 upon the sapphire face as shown in FIG. 1(c). The principle of the LLO process relies upon the different absorption behaviors between sapphire and GaN. A collimated laser beam 15 from a high-power laser can be irradiated through a shadow mask 16 and through the substrate surface 10 of the device over regions to be lifted-off. The shadow mask 16 can be designed to provide coverage over selected regions. The material of the masked regions should have low transmission at the wavelength of the irradiation laser (e.g., ultraviolet (UV)), while the unmasked regions should be transparent to the laser beam. The masked regions can remain attached to the sapphire substrate, while the unmasked regions can become detached. Such radiation at UV wavelengths can pass through the sapphire substrate due to its high band-gap energy of ~10 eV but is strongly absorbed by GaN with a band-gap of ~3.4 eV. As a result, ablation can occur at the GaN/sapphire interface, enabling detachment of the sapphire substrate.

In many embodiments, a high-energy, pulsed-mode laser at a UV wavelength can be used as an irradiation source. Examples of such a laser include but are not limited to ArF excimer lasers ($\lambda$=193 nm), KrF ($\lambda$=248 nm) excimer lasers, and frequency-quadrupled Nd:YAG lasers ($\lambda$=266 nm). A collimated beam is preferred in order to provide uniform intensity across the irradiated areas. The beam can be collimated with the aid of an external beam expander. Such lift-off processes can also be employed for many compound semiconductors grown on sapphire substrates, including but not limited to AN, AlGaN, GaN, InGaN, InN, and AlGaInN. The sapphire can be detached instantly after laser irradiation.

The processed sample can be entirely immersed into a bath, such as a solvent bath (e.g., an acetone bath), to dissolve the adhesive (e.g., epoxy), allowing the LED to be completely detached from the supporting substrate and forming a suspended free-stranding structure partially attached to the sapphire base. As an example, an acetone bath can be used to completely dissolve the epoxy resin in about 3 hours.

Figures 2A, 2B:
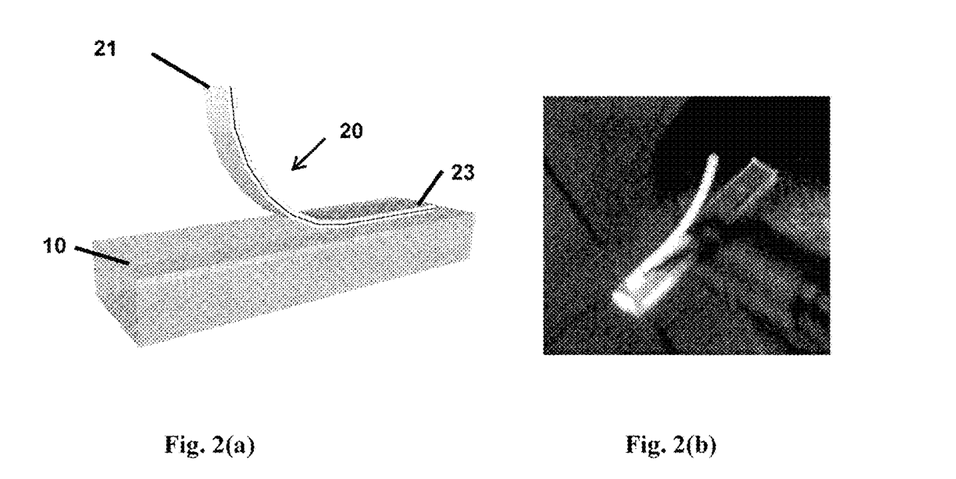
FIG. 2(a) shows a perspective view of a flexible free-standing LED strip according to an embodiment of the subject invention.
FIG. 2(b) shows an image of a flexible free-standing LED strip according to an embodiment of the subject invention.

Referring to FIG. 1(d), the exposed regions of the device 20 can be detached from the substrate 10 while the masked region remains attached. After complete removal of the adhesive, the LED strip can become suspended to form a free-standing structure that bends (e.g., upwards as depicted in FIG. 1(d)) due to the existence of built-in strain in the semiconductor film. FIG. 2(a) shows a schematic view of a single strip 20 with a free end 21 and an end 23 that remains attached to the substrate 10. FIG. 2(b) shows an image of such a strip 20. Also, during a fabrication process, arrays of suspended GaN strips can be formed. In either case, the suspended GaN strips are flexible and can sustain an external force applied by a foreign object that causes movement (i.e., bending of the strip). After bending, the strip will snap back into its original shape without deformation and/or damage (or with minimal deformation and/or damage).

In an embodiment, the LED chip can be bonded to a TO-can package using an adhesive (e.g., epoxy), and bond pads can be connected to the package by wire bonding. By applying a voltage bias, the free-standing LED device can be illuminated. The dimension of the LED device can depend upon practical needs but is not limited by this method.

Even though the LEDs can have noticeable curvatures, they can still emit light or electroluminescence when power is applied. In fact, light can be emitted from both the upper surface and the lower surface of the suspended LED film. This light emission can be uniform over the entire device if the spreading layer is properly designed. Further, while the materials specifically disclosed thus far can produce a blue color, embodiments are not limited thereto. The present invention is compatible with making LEDs of many different colors. For example, embodiments of the subject invention are compatible with GaN-based LEDs grown on sapphire. The direct band gap of semiconductors consisting of InGaN (from 0.7 eV to 3.4 eV) or AlGaN (from 3.4 eV to 6.2 eV) provide quantum wells that can cover a wide spectral range, from 200 nm to 1770 nm, and the emission wavelength (color) can be designed based on indium and aluminum compositions.

Figure 3:
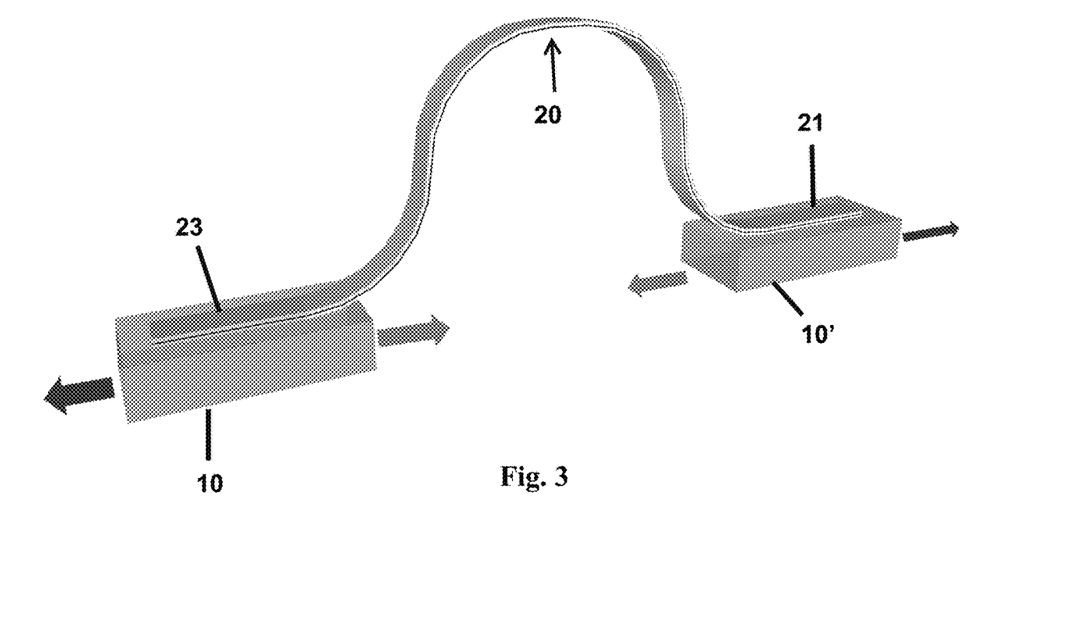
FIG. 3 shows a perspective view and an image of an LED strip with tunable curvatures according to an embodiment of the subject invention.

FIG. 3 includes a schematic diagram and an image illustrating an LED strip with a tunable curvature according to an embodiment of the subject invention. To achieve controllable curvatures of the flexible LED strip, the free or suspended end 21 shown in FIG. 2(a) can be attached to a separated substrate 10', while the attached end 23 remains connected to the original substrate (e.g., sapphire) 10. As a result, the amount of curvature in the strip 20 can be fine-tuned by manipulating the separation of two ends 21, 23 by moving substrates 10, 10'. The tunable curvature of a flexible LED/display can offer optimum viewing angles and controllable emission divergence.

Figure 4:
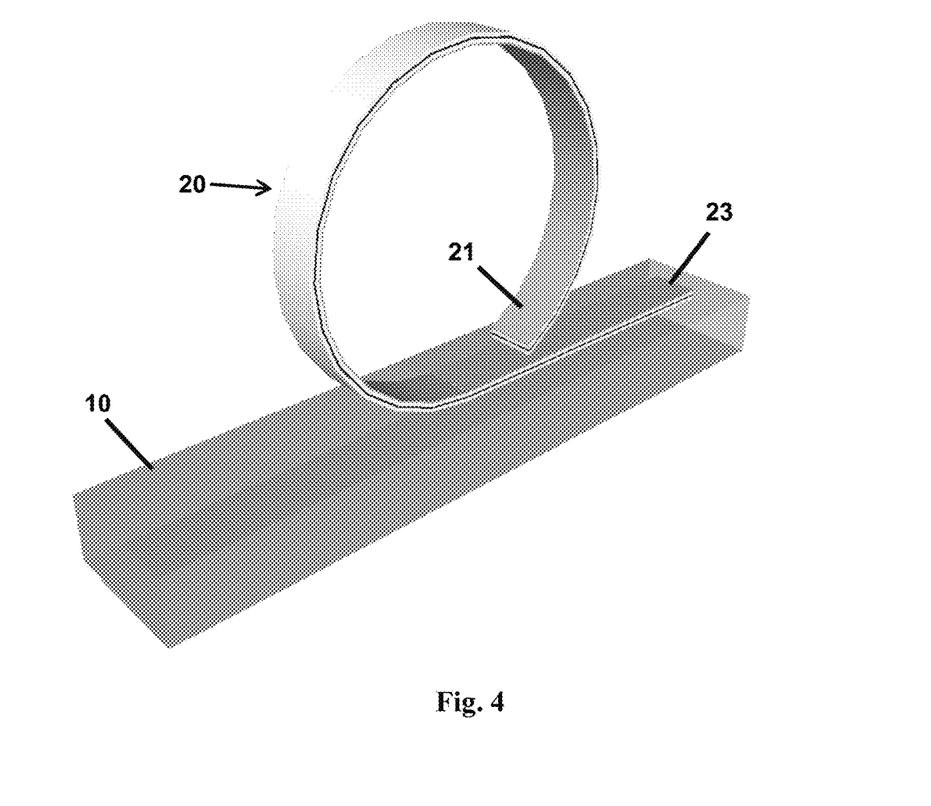
FIG. 4 shows a perspective view of an LED rolled up into a tube-shaped LED according to an embodiment of the subject invention.

FIG. 4 is a schematic diagram of an LED strip rolled into a micro-tube LED. As discussed above and as shown in FIG. 2(a), the LED strip can be suspended to form a free-standing structure which bends due to the built-in strain in the semiconductor film. The degree of curvature can be governed by the thickness, length, and strain of the semiconductor film. By optimizing these factors, a size-tunable micro-tube LED can be formed by self-rolling of the GaN strip, as depicted in FIG. 4. Apart from lighting purposes, the size-tunable micro-tube LED, which is bendable, can be used to roll along a blood vessel wall and act as an illumination source for a bio-sensor. It can selectively illuminate small parts of blood vessels and detect the signal from scattered/reflected light, so as to generate analysis data for identifying the composition of the measured portion based on the intensity information. It is thus usable as an ultra-compact diagnostic tool for detecting diseases and cancer cells.

Figure 5:
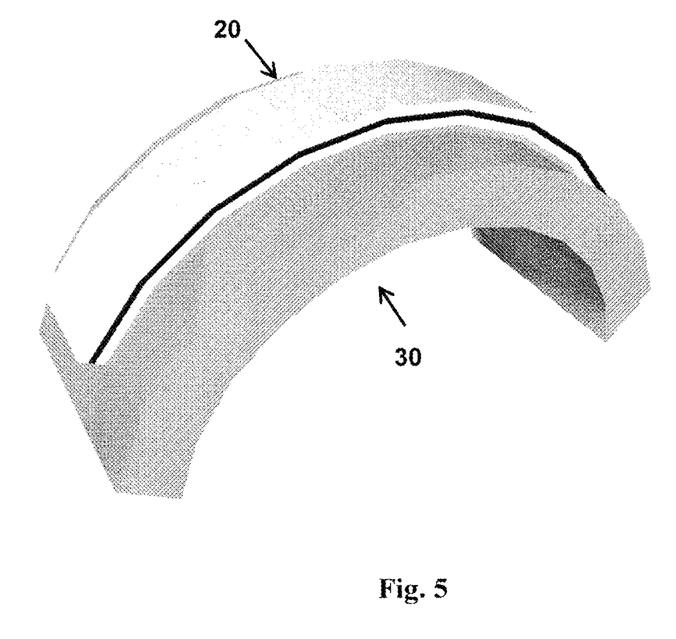
FIG. 5 shows a perspective view of an LED structure attached to a curved foreign substrate according to an embodiment of the subject invention.

FIG. 5 shows a schematic view of an LED strip according to an embodiment of the subject invention. Referring to FIG. 5, in an embodiment, the flexible LED strip 20 can be detached completely from the sapphire substrate on which it was formed and subsequently attached onto a foreign substrate 30. In particular, through the exposure of the entire GaN strip to the laser beam during the laser lift-off process, the flexible GaN strip is able to completely detach from the substrate. It can then be transferred onto a foreign substrate 30, including but not limited to a metal or polymer. It can be attached to the foreign surface by epoxy or other suitable adhesive. As a result, the LED 20 can adopt the shape of the surface of the foreign substrate 30.

The foreign substrate 30 can be solid or it may be flexible itself, such as plastic or cloth. In this way, if the other substrate 30 is chosen so that its mechanical strength is greater than that of the LED structure 20, the other substrate 30 can improve the overall strength so that the arrangement can be used for additional practical applications (e.g., LED-enabled apparel).

The LED structure is flexible itself, and it can be usable in that form. It could also be attached to a flexible substrate to give it strength as discussed above. In one embodiment, the flexible structure can be coated with one or more thick, soft metal layers. The soft metal layers, such as copper, gold, or tin, can be coated onto the surfaces of the semiconductor using one of several methods, including but not limited to electroplating, thermal spraying, or thermal evaporation. The thick, soft metal layer can function as a flexible support, an electrically-conductive layer, and/or a bonding pad. The entire LED can thus be bent on its own.

Figure 6A:
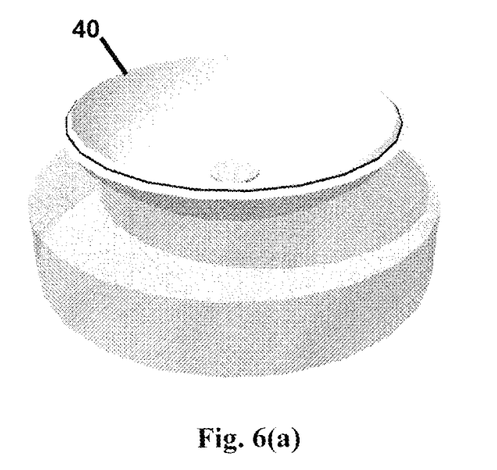
FIG. 6(a) shows a perspective view of an LED formed as a bowl-shaped LED according to an embodiment of the subject invention.
Figure 6B:
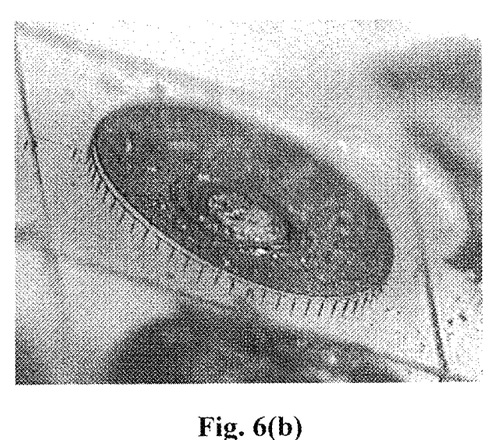
FIG. 6(b) is an image of an LED formed as a bowl-shaped LED according to an embodiment of the subject invention.

As described in the fabrication steps shown in FIGS. 1(a)-1(d), the detached and curved part of the flexible LED structure can be directly related to the region exposed to the collimated UV beam from a high-power pulsed-mode laser (e.g., a 266 nm YAG laser). In one embodiment, a bowl-shaped LED 40 can be achieved by leaving the central region of a circular LED firmly attached to a substrate and allowing the other regions to naturally curve up to form a bowl. This represents a compact and elegant way to alter the emission divergence of an LED. FIG. 6(a) is a schematic diagram and FIG. 6(b) is an image of such a bowl-shaped micro-LED. In particular, the bowl-shaped LED can condense the original Lambertian emission pattern into a narrower beam, without the use of external optics, such as parabolic reflectors and collimators. It can used for highly directional lighting purposes, including projectors, flashlights, automobile headlamps, and fiber-coupled light sources.

Figure 7A:
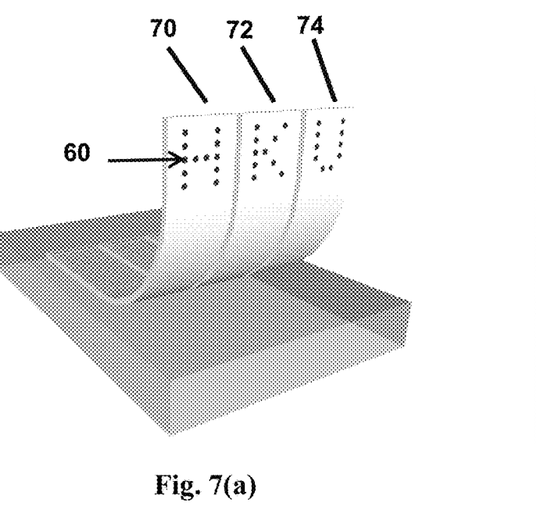
FIG. 7(a) shows a perspective view of an LED arranged as a flexible free-standing LED display according to an embodiment of the subject invention.
Figure 7B:
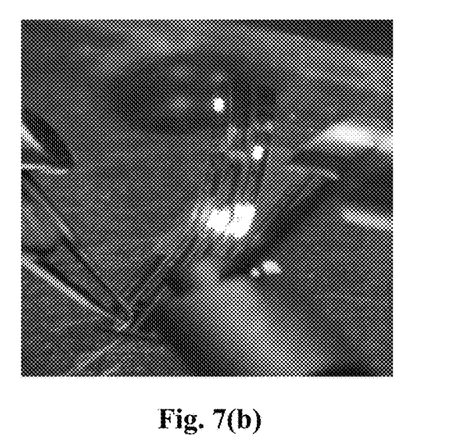
FIG. 7(b) shows an image of an LED arranged as a flexible free-standing LED display according to an embodiment of the subject invention

In one embodiment, prior to the attaching and selective lift-off processes, a GaN emissive micro-pixel array 60 can be formed on one end of each of a plurality of LED strips 70, 72, 74 by a standard fabrication process. With a proper design of the metal contact layer, the individual pixels of the array can be operated independently to construct a micro-display panel as illustrated in FIG. 7(a). FIG. 7(b) shows an image of the array of FIG. 7(a). Though three LED strips 70, 72, 74 are depicted in FIGS. 7(a) and 7(b), this is for exemplary purposes only; any suitable number of LED strips can be used.

Each of the emitting elements in the array can be formed on a continuous-film flexible LED by the fabrication process, with a portion attached to the rigid substrate, while the detached portions constitute the flexible emission pixel. The two-dimensional LED mesa array can be defined by photolithography combined with a dry etching process. The sidewalls of mesas can then be passivated by insulating materials (e.g., silicon dioxide or aluminum oxide, though embodiments are not limited thereto), to inhibit electrical shorting between the p-type and n-type layers. A layer of oxide can be coated over the entire surface using, for example, electron beam evaporator or plasma-enhanced chemical vapor deposition (PECVD). Another photolithography process can then be employed to expose the top surface of mesas, and the oxide above them can be removed, for example by plasma etching. Once the isolated mesa array is metallized with separated contracting lines, the individual pixels can be operated independently to construct the microdisplay panel of FIG. 7. The overall device can be connected to a suitable external matrix driver for operation so that the LED pixels are individually-controllable.

An implementation can also extend to flexible displays using the methods described herein. A two-dimensional array of LED pixels can be fabricated using micro-fabrication procedures. The LED pixels can be formed on a continuous semiconductor film, and can be designed to be individually controllable by matrix interconnection of the pixels using metal interconnects. One or more thick, soft metal layers can be coated onto the display chip, followed by removal of the substrate (e.g., sapphire substrate), giving flexibility to the display. The array size and resolution of the display can be scalable.

Figure 8:
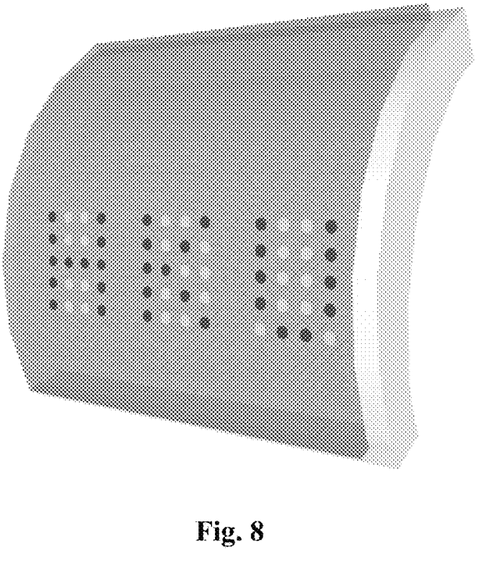
FIG. 8 shows a perspective view of a continuous-film flexible LED display on a flexible substrate according to an embodiment of the subject invention.

The two-dimensional LED pixel array can also be bonded to a flexible substrate (e.g., a polymer substrate, though embodiments are not limited thereto), and the sapphire substrate can subsequently be removed by mechanical/chemical etching or a LLO process. As such, a flexible display as shown in FIG. 8 can be formed. The array size and resolution of the display can be scalable.

Figure 9A:
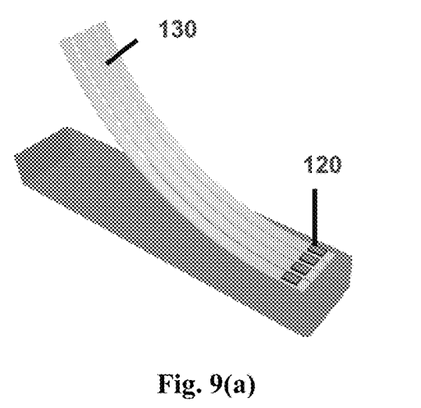
FIG. 9(a) shows a perspective view of a photonic system according to an embodiment of the subject invention.
Figure 9B:
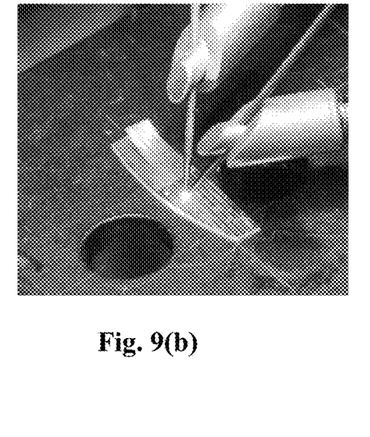
FIG. 9(b) shows an image of a photonic system according to an embodiment of the subject invention.

FIG. 9(a) shows a perspective view of a photonic system according to an embodiment of the subject invention, and FIG. 9(b) shows an image thereof. Referring to FIG. 9(a), a photonic system can include a light-emitting diode 120 and an optical waveguide 130. The LED can be formed on one end of a continuous semiconductor film attached on a rigid substrate, and the remaining film can act as an optical waveguide that is flexible itself. The LED 120 and/or the optical waveguide 130 can be fabricating using methods described herein. A one-dimensional array consisting of multiple channels can be fabricated using micro-fabrication procedures. The array size and waveguide dimension can be scalable.

Figure 10A:
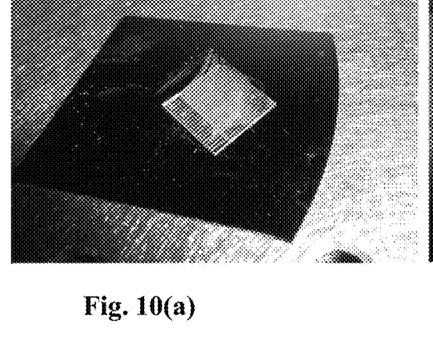
FIGS. 10(a) and 10(b) show images of suspended GaN strip arrays.
Figure 10B:
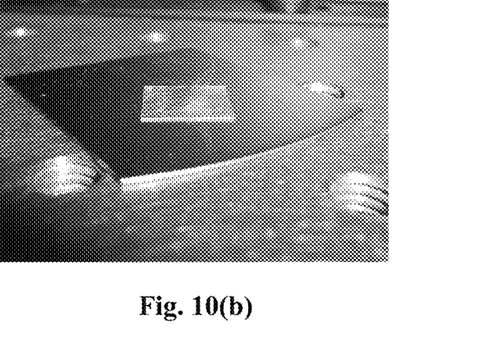
Figure 11A:
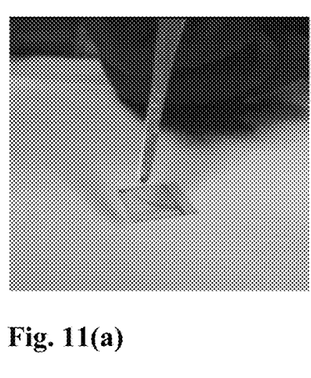
FIGS. 11(a)-11(c) show images of GaN strips according to embodiments of the subject invention, showing the flexibility thereof.
Figure 11B:
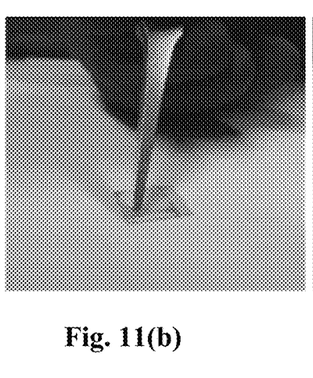
Figure 11C:
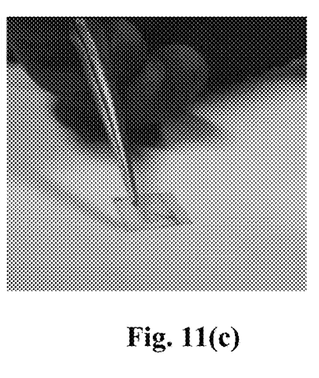
Figure 12:
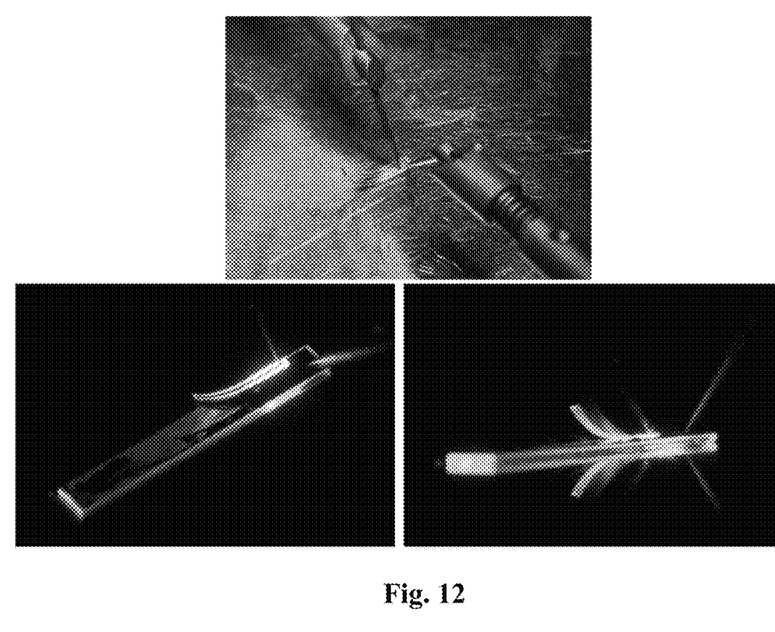
FIG. 12 shows images of flexible GaN LED strips according to embodiments of the subject invention, showing the electroluminescence thereof.
Figure 13:
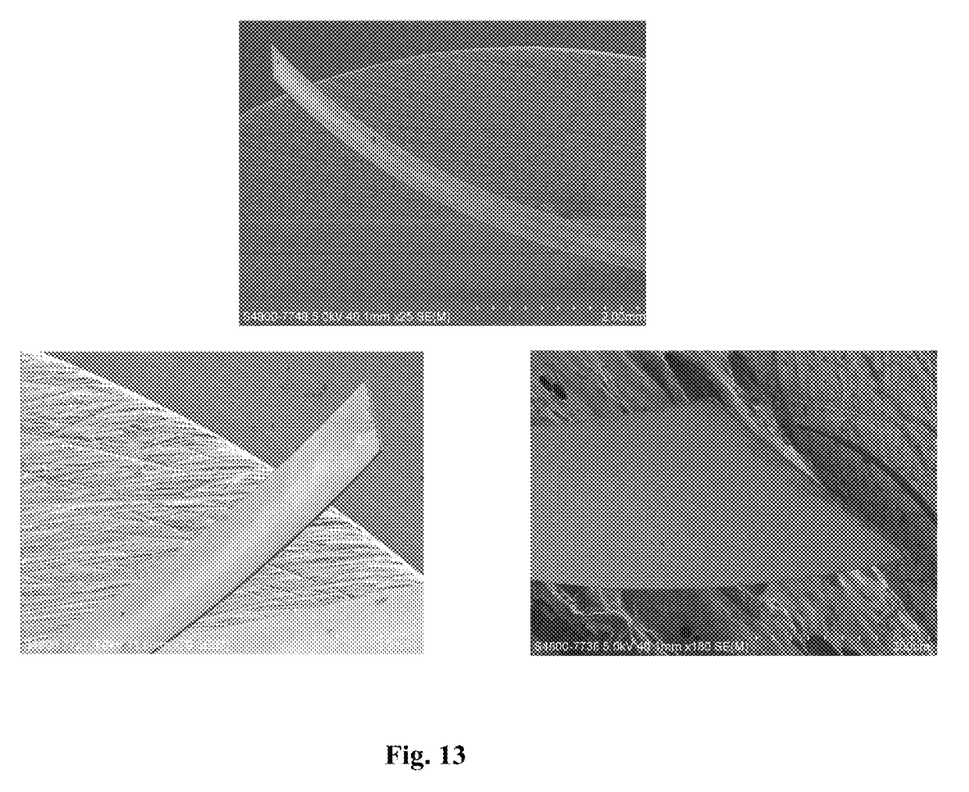
FIG. 13 shows scanning electron microscope (SEM) images of strips according to embodiments of the subject invention, showing the flexibility thereof.

FIGS. 10(a) and 10(b) show images of suspended GaN strip arrays, FIGS. 11(a)-11(c) show images of GaN strips according to embodiments of the subject invention, and FIG. 13 shows SEM images of strips according to embodiments of the subject invention. Referring to FIGS. 10(a), 10(b), 11(a)-11(c), and 13, the strips of the subject invention are quite flexible. FIG. 12 shows images of flexible GaN LED strips according to embodiments of the subject invention. Referring to FIG. 12, these strips can have electroluminescence.

While the invention has been particularly shown and described with reference to preferred embodiments thereof, it will be understood by those skilled in the art that various changes in form and details may be made therein without departing from the spirit and scope of the invention. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all implementations falling within the scope of the appended claims, and equivalents thereof.

All patents, patent applications, provisional applications, and publications referred to or cited herein (including those in the "References" section) are incorporated by reference in their entirety, including all figures and tables, to the extent they are not inconsistent with the explicit teachings of this specification.

REFERENCES

[1] J. Chun, Y. Hwang, Y. S. Choi, T. Jeong, J. H. Baek, H. C. Ko, and S. J. Park, IEEE Photon. Technol. Lett. 24, 2115 (2012).

[2] S. Y. Lee, K. I. Park, C. Huh, M. Koo, H. G. Yoo, S. Kim, C. S. Ah, G. Y. Sung, and K. J. Lee, Nano Energy 1, 145 (2012).

What we claimed is:

1. A method of fabricating a continuous-film, crystalline, semiconductor, flexible, free-standing light-emitting diode (LED), the method comprising:

forming an LED structure on a first rigid substrate;
attaching the LED structure to a supporting substrate using an adhesive;
using a selective laser lift-off (LLO) process through a shadow mask to separate at least a portion of the LED structure from the first rigid substrate; and
immersing the LED structure in a solvent bath to dissolve the adhesive and separate the LED structure from the rigid supporting substrate;
wherein the shadow mask comprises a masked region having low transmission and a transparent unmasked region,
wherein the masked region provides coverage over at least one selected region in which the LED structure is on the first rigid substrate, and
wherein the method further comprises separating a region of the first rigid substrate corresponding to the transparent unmasked region from the LED structure, while a region of the first rigid substrate corresponding to the masked region attached on the LED structure remains.

2. The method according to claim 1, wherein the first rigid substrate is a sapphire substrate.

3. The method according to claim 1, wherein the adhesive is an epoxy.

4. The method according to claim 1, wherein the supporting substrate is rigid.

5. The method according to claim 4, wherein the supporting substrate is glass or silicon.

6. The method according to claim 1, wherein the supporting substrate is flexible.

7. The method according to claim 6, wherein the supporting substrate is a polymeric substrate.

8. The method according to claim 1, wherein the LED is a GaN-based semiconductor.

9. The method according to claim 8, wherein forming the LED structure on the first rigid substrate comprises:
growing a GaN-based wafer by metal organic chemical vapor deposition (MOCVD) or molecular beam epitaxy (MBE) on the first rigid substrate;
forming the LED structure using micro-fabrication procedures, wherein the micro-fabrication procedures comprise photolithography, etching, and metal deposition; and
dicing the wafer into LED chips using pulsed ultraviolet (UV) laser machining or diamond-dicing sawing.

10. The method according to claim 1, wherein attaching the LED structure to the supporting substrate using the adhesive comprises:
applying the adhesive to the LED structure; and
curing the adhesive to a solid state.

11. The method according to claim 1, wherein using the selective LLO process to separate at least a portion of the LED structure from the first rigid substrate comprises: passing a high-energy, pulsed-mode laser beam at UV wavelengths through the shadow mask and through the first rigid substrate over regions of the LED structure to be lifted-off of the first rigid substrate.

12. The method according to claim 11, wherein the high-energy, pulsed-mode laser beam is a 266 nm YAG laser.

13. The method according to claim 1, wherein a plurality of LED structures is formed as an array on the first rigid substrate so that a plurality of LED strips is formed at once.

14. The method according to claim 1, wherein the flexible, free-standing LED structure has a first end attached to the first rigid substrate and a second end opposite to the first end freely suspended, and wherein the method further comprises:

providing a second rigid substrate;
attaching the freely suspended end to the second rigid substrate; and
moving the first and second rigid substrates to tune the curvature of the LED structure.

15. The method according to claim 1, wherein the flexible, free-standing LED structure has a first end attached to the first rigid substrate and a second end opposite to the first end freely suspended, and wherein the method further comprises adjusting the thickness, length, and strain of the LED structure so that it rolls itself into a tube-shaped LED.

16. The method according to claim 1 wherein using the selective LLO process to separate at least a portion of the LED structure from the first rigid substrate comprises:
selectively lifting off polygonal or circular shaped mesas; and detaching surrounding regions from the first rigid substrate to form a bowl-shaped micro-LED structure.

17. The method according to claim 1, wherein the LED structure is a suspended continuous film that bends due to strain in a semiconductor film of the LED structure.

18. The method according to claim 1, further comprising attaching multiple flexible LED structures onto a second rigid substrate to form a flexible display, the flexible display comprising:
at least one pixel; and
a two-dimensional array of discrete continuous semiconductor film LED structures.

19. The method according to claim 18, wherein the discrete continuous semiconductor film LED structures are individually controllable.

20. A method of fabricating a continuous-film, crystalline, semiconductor, flexible, free-standing light-emitting diode (LED), the method comprising:
forming an LED structure on a first rigid substrate;
attaching the LED structure to a supporting substrate using an adhesive;
using a selective laser lift-off (LLO) process to separate at least a portion of the LED structure from the first rigid substrate; and
immersing the LED structure in a solvent bath to dissolve the adhesive and separate the LED structure from the rigid supporting substrate,
wherein the LED is a GaN-based semiconductor, and
wherein fowling an LED structure on a first rigid substrate comprises:
creating emissive micro-pixel arrays at ends of strips that will be freely suspended after the immersing step; and
creating a metal contact layer so that individual pixels can be operated independently so as to construct a micro-display panel.

21. A method of fabricating a continuous-film, crystalline, semiconductor, flexible, free-standing light-emitting diode (LED), the method comprising:
forming an LED structure on a first rigid substrate;
attaching the LED structure to a supporting substrate using an adhesive;
using a selective laser lift-off (LLO) process through a shadow mask to separate at least a portion of the LED structure from the first rigid substrate; and
immersing the LED structure in a solvent bath to dissolve the adhesive and separate the LED structure from the rigid supporting substrate,
wherein the LED structure is attached to at least one additional separate rigid substrate so that a curvature of the LED structure is tunable by adjusting spacing between the rigid substrates, wherein the shadow mask comprises a masked region having low transmission and a transparent unmasked region, wherein the masked region provides coverage over at least one selected region in which the LED structure is on the first rigid substrate, and wherein the method further comprises separating a region of the first rigid substrate corresponding to the transparent unmasked region from the LED structure, while a region of the first rigid substrate corresponding to the masked region attached on the LED structure remains.

22. A method of fabricating an inorganic, continuous-film, crystalline, semiconductor, flexible LED device without attachment to a substrate, the method comprising:

forming a GaN-based LED device from GaN-based LED wafers grown on sapphire substrates;

depositing a soft metal layer onto the GaN-based LED device after forming the GaN-based LED device; and completely detaching the sapphire substrates by complete laser lift-off, after depositing the soft metal layer onto the GaN-based LED device, to form the flexible LEDs, wherein the soft metal layer is a flexible support such that the entire LED device is bent.

23. The method according to claim 22, wherein the soft metal layer is deposited by electroplating or thermal evaporation.

24. The method according to claim 22, wherein the entire LED device is flexible.

25. The method according to claim 22, wherein the LED device is a display, and wherein forming the GaN-based LED device from GaN-based LED wafers grown on sapphire substrates comprises forming a GaN-based LED display from GaN-based LED wafers grown on sapphire substrates.

26. The method according to claim 25, wherein the LED display comprises a two-dimensional array of LED devices serving as pixels of the display.

27. The method according to claim 26, wherein the pixels of the display are interconnected in a matrix-addressable fashion.

28. The method according to claim 22, further comprising attaching the LED device, after completely detaching the sapphire substrates by complete laser lift-off, to a surface of a foreign substrate, wherein the LED adopts a shape of the surface of the foreign substrate.

29. A method of fabricating a photonic system, the method comprising the steps of:

fabricating a continuous-film, crystalline, semiconductor, flexible, free-standing light-emitting diode (LED);

attaching one region of the LED to a second rigid substrate; and detaching the remaining regions of the LED from the second rigid substrate to form an optical waveguide of the photonic system, wherein fabricating the continuous-film, crystalline, semiconductor, flexible, free-standing LED comprises:

forming an LED structure on a first rigid substrate;

attaching the LED structure to a supporting substrate using an adhesive;

using a selective laser lift-off (LLO) process to separate at least a portion of the LED structure from the first rigid substrate; and immersing the LED structure in a solvent bath to dissolve the adhesive and separate the LED structure from the rigid supporting substrate.

* * * * *